(12) United States Patent
Liu et al.

(10) Patent No.: US 7,425,135 B2
(45) Date of Patent: Sep. 16, 2008

(54) FLEX CIRCUIT ASSEMBLY

(75) Inventors: Yue Liu, Plymouth, MN (US); Klein L. Johnson, Orono, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/094,990

(22) Filed: Mar. 31, 2005

(65) Prior Publication Data
US 2005/0245118 A1  Nov. 3, 2005

Related U.S. Application Data

(60) Provisional application No. 60/566,665, filed on Apr. 30, 2004.

(51) Int. Cl.
*H01R 12/00* (2006.01)
(52) U.S. Cl. .......................... 439/67; 439/329
(58) Field of Classification Search ............... 439/67, 439/493, 329, 567, 470, 472, 66
See application file for complete search history.

(56) References Cited

U.S. PATENT DOCUMENTS

| | | | |
|---|---|---|---|
| 3,271,214 A | 9/1966 | Tabor | |
| 3,629,787 A * | 12/1971 | Wilson | 439/67 |
| 3,987,676 A | 10/1976 | Bennewitz | |
| 4,092,061 A | 5/1978 | Stigliani, Jr. | |
| 4,128,697 A | 12/1978 | Simpson | |
| 4,162,817 A * | 7/1979 | Briggs et al. | 439/329 |
| 4,295,696 A * | 10/1981 | Gray | 439/55 |
| 4,375,578 A | 3/1983 | Mitchell et al. | |
| 4,435,031 A * | 3/1984 | Black et al. | 439/82 |
| 4,435,740 A | 3/1984 | Huckabee et al. | |
| 4,769,684 A | 9/1988 | Crocker et al. | |
| 4,818,099 A | 4/1989 | Preikschat et al. | |
| 4,952,016 A | 8/1990 | Adams et al. | |
| 4,953,006 A | 8/1990 | Kovats et al. | |
| 4,962,991 A | 10/1990 | Carvalho | |
| 4,973,211 A * | 11/1990 | Potucek | 411/452 |
| 5,044,980 A * | 9/1991 | Krumme et al. | 439/496 |
| 5,125,054 A | 6/1992 | Ackley et al. | |
| 5,136,682 A | 8/1992 | Moyer et al. | |

(Continued)

FOREIGN PATENT DOCUMENTS

GB   0 881 671    12/1998

(Continued)

OTHER PUBLICATIONS

U.S. Appl. No. 10/409,837, filed Apr. 9, 2003, Kumar et al.

(Continued)

*Primary Examiner*—Renee S Luebke
*Assistant Examiner*—Larisa Z Tsukerman
(74) *Attorney, Agent, or Firm*—Workman Nydegger

(57) ABSTRACT

An assembly for coupling an electrical device with a rigid structure using a flex circuit is provided. The assembly includes a staple having posts which extend into the rigid structure and secure the staple to the rigid structure. The flex circuit couples with both the rigid structure and the electrical device. The flex circuit extends between the staple and the rigid structure such that the flex circuit couples with the rigid structure thereby providing an interconnection between the electrical device and the rigid structure.

11 Claims, 7 Drawing Sheets

U.S. PATENT DOCUMENTS

| | | | |
|---|---|---|---|
| 5,212,345 A | 5/1993 | Gutierrez | |
| 5,249,245 A | 9/1993 | Lebby et al. | |
| 5,253,311 A | 10/1993 | Killen et al. | |
| 5,262,590 A | 11/1993 | Lia | |
| 5,299,276 A | 3/1994 | Okamura et al. | |
| 5,359,686 A | 10/1994 | Galloway et al. | |
| 5,361,317 A | 11/1994 | Hartman et al. | |
| 5,371,820 A | 12/1994 | Welbourn et al. | |
| 5,371,822 A | 12/1994 | Horwitz et al. | |
| 5,375,184 A | 12/1994 | Sullivan | |
| 5,389,686 A | 2/1995 | Diop et al. | |
| 5,414,786 A | 5/1995 | Ohta et al. | |
| 5,420,954 A | 5/1995 | Swirhun et al. | |
| 5,432,630 A | 7/1995 | Lebby et al. | |
| 5,462,441 A * | 10/1995 | Renn et al. | 439/67 |
| 5,471,552 A | 11/1995 | Wuu et al. | |
| 5,474,463 A * | 12/1995 | Robinson et al. | 439/159 |
| 5,495,125 A | 2/1996 | Uemura | |
| 5,499,312 A | 3/1996 | Hahn et al. | |
| 5,539,848 A | 7/1996 | Galloway | |
| 5,545,846 A | 8/1996 | Williams et al. | |
| 5,596,662 A | 1/1997 | Boscher | |
| 5,613,024 A | 3/1997 | Shahid | |
| 5,625,734 A | 4/1997 | Thomas et al. | |
| 5,638,469 A | 6/1997 | Feldman et al. | |
| 5,666,449 A | 9/1997 | Sawae et al. | |
| 5,703,895 A | 12/1997 | Ghirardi et al. | |
| 5,706,378 A | 1/1998 | Suzuki et al. | |
| 5,717,800 A | 2/1998 | Funabashi | |
| 5,733,151 A * | 3/1998 | Edsall et al. | 439/729 |
| 5,752,851 A * | 5/1998 | Zaderej et al. | 439/493 |
| 5,774,614 A | 6/1998 | Gilliland et al. | |
| 5,894,409 A | 4/1999 | Tanaka | |
| 5,974,214 A | 10/1999 | Shacklette et al. | |
| 6,010,359 A * | 1/2000 | Etters et al. | 439/496 |
| 6,011,695 A | 1/2000 | Dumke | |
| 6,017,222 A * | 1/2000 | Kao | 439/67 |
| 6,039,600 A * | 3/2000 | Etters et al. | 439/496 |
| 6,040,624 A | 3/2000 | Chambers et al. | |
| 6,045,269 A | 4/2000 | Watanabe et al. | |
| 6,069,991 A | 5/2000 | Hibbs-Brenner et al. | |
| 6,088,498 A | 7/2000 | Hibbs-Brenner et al. | |
| 6,091,475 A | 7/2000 | Ogino et al. | |
| 6,118,666 A | 9/2000 | Aoki et al. | |
| 6,162,065 A * | 12/2000 | Benham | 439/67 |
| 6,195,261 B1 | 2/2001 | Babutzka et al. | |
| 6,268,231 B1 | 7/2001 | Wetzel | |
| 6,294,255 B1 * | 9/2001 | Suzuki et al. | 428/375 |
| 6,326,553 B1 | 12/2001 | Yim et al. | |
| 6,380,493 B1 | 4/2002 | Morita et al. | |
| 6,404,960 B1 | 6/2002 | Hibbs-Brenner et al. | |
| 6,473,314 B1 | 10/2002 | Custer et al. | |
| 6,485,322 B1 | 11/2002 | Branch et al. | |
| 6,521,989 B2 | 2/2003 | Zhou | |
| 6,537,082 B2 * | 3/2003 | Hopfer et al. | 439/67 |
| 6,586,678 B1 | 7/2003 | Rosenberg et al. | |
| 6,617,518 B2 | 9/2003 | Ames et al. | |
| 6,703,561 B1 | 3/2004 | Rosenberg et al. | |
| 6,709,607 B2 | 3/2004 | Hibbs-Brenner et al. | |
| 6,767,220 B2 * | 7/2004 | Wilson et al. | 439/67 |
| 6,769,920 B1 * | 8/2004 | Mease et al. | 439/67 |
| 6,809,905 B2 * | 10/2004 | Kilmer | 360/264.2 |
| 6,863,453 B2 | 3/2005 | Wang et al. | |
| 2002/0170742 A1 | 11/2002 | Liaw et al. | |
| 2003/0102157 A1 | 6/2003 | Rosenberg et al. | |
| 2003/0197254 A1 | 10/2003 | Huang | |
| 2004/0018409 A1 | 1/2004 | Hui et al. | |
| 2004/0062491 A1 | 4/2004 | Sato et al. | |
| 2004/0090620 A1 | 5/2004 | Farr | |
| 2004/0092135 A1 | 5/2004 | Hofmesiter et al. | |
| 2005/0130488 A1 * | 6/2005 | Zhu et al. | 439/470 |

FOREIGN PATENT DOCUMENTS

| | | |
|---|---|---|
| GB | 0 905 838 | 3/1999 |
| JP | 61-071689 | 4/1986 |
| JP | 62/114545 | 5/1987 |
| JP | 63-136680 | 6/1988 |
| JP | 01-169986 | 5/1989 |
| JP | 02-240989 | 9/1990 |
| JP | 03-0148190 | 6/1991 |
| JP | 406034838 | 2/1994 |
| JP | 407159636 | 6/1995 |
| JP | 09-223848 | 8/1997 |
| WO | 92/00538 | 1/1992 |

OTHER PUBLICATIONS

U.S. Appl. No. 10/835,832, filed Apr. 30, 2004, Kumar et al.
U.S. Appl. No. 10/836,728, filed Apr. 30, 2004, Ellison.
U.S. Appl. No. 10/687,107, Oct. 16, 2003, Aronson et al.
U.S. Appl. No. 10/836,129, filed Apr. 30, 2004, Nippa et al.
U.S. Appl. No. 11/179,223, filed Jul. 11, 2005, Ice.
Murata, S., Nishimura, K., *Improvement in Thermal Properties of a Multi-Beam Laser Diode Array*, Japanese Journal of Applied Physics, vol. 28, Suppl. 28-3, pp. 165-170 (1989).
Ali, "New Materials and Design Components for Integrated Optics," Technology Report/Fiberoptics, Laser Focus World, vol. 21, No. 8, Aug. 1985, Tulsa, U.S., pp. 48-50.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-chip Approach to Endfire Coupling Between Single-Mode Optical Fibres and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.
Plawsky, et al., "Photochemically Machined, Glass Ceramic, Optical Fiber Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.

* cited by examiner

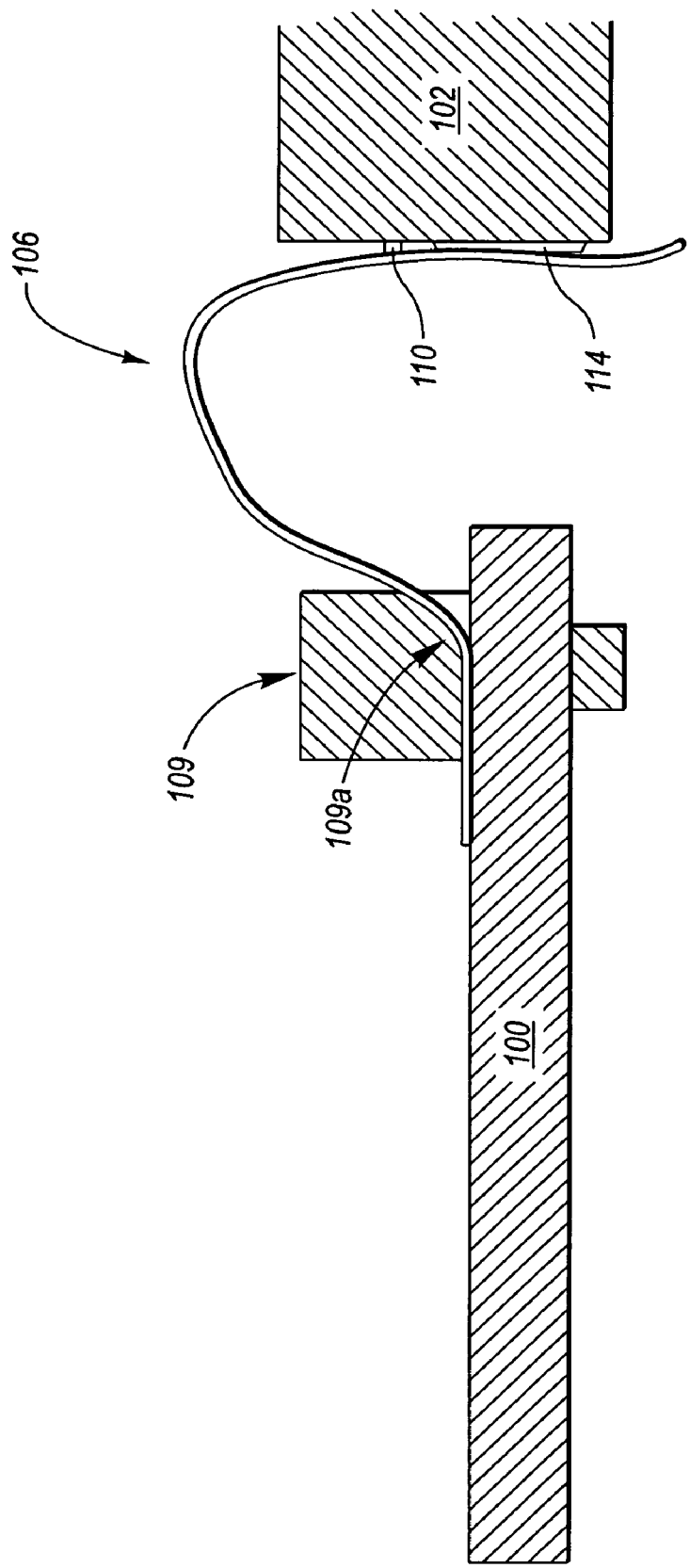

FLEX CIRCUIT ASSEMBLY

CROSS-REFERENCE TO RELATED APPLICATIONS

This application claims the benefit of U.S. Provisional Application No. 60/566,665, filed Apr. 30, 2004 and entitled FLEX CIRCUIT ASSEMBLY, which is hereby incorporated by reference.

BACKGROUND OF THE INVENTION

1. Field of the Invention

The present invention relates to flex circuits and more particularly to an assembly which couples a flex circuit between an electronic or optoelectronic device and a rigid structure.

2. Discussion of the Related Art

Electronic devices play an increasingly critical role in the lives of many consumers today. For example, applications as simple as listening to a compact disc player to applications incorporated in life saving machines used in emergency rooms implement electronic devices. Many of these devices read and transfer data using electro-optics.

These devices employ electro optical components capable of reading a medium. These applications may alternatively implement electronic components capable of transmitting and receiving information through a medium. These applications include various components, such as printed circuit boards (PCBs), integrated circuits, passive electrical components, photodetectors, and lasers.

The electronic components associated with these devices must of course electrically interconnect with one another. Among the components which may be used to electrically interconnect the components are flex circuits. Flex circuits typically include a single or multilayer electrically insulating material laminated to or otherwise patterned with metallic conductive pathways, possibly with a protective mask layer covering the multilayer materials to provide electrical isolation. Flex circuits are highly desirable. For example, they are relatively light weight and take-up little space. Flex circuit are also flexible and, because they are flexible, they are easy to install. Furthermore, flex circuits generally exhibit good impedance control, reliability and repeatability, thermal management characteristics, as well as uniform electrical characteristics, which is particularly important in high speed circuitry applications.

FIG. 1 shows a flex circuit 10 connected to a rigid structure in accordance with prior conventional techniques. In this example, the flex circuit 10 connects with a rigid structure such as a PCB 14 by soldering cantilevered leads as shown in related art FIG. 1. As shown, a series of leads 111 associated with the flex circuit 10 are soldered to the PCB 14. However, the soldering joints between the leads 11 and the PCB 14 are stress points where failure may occur. Efforts to reduce the stress at these joints have included applying a bead of adhesive 12 at the soldering joints, thereby providing strain relief as shown in related art FIG. 1. Other efforts to reduce the stress at these joints have included using mechanical fasteners along with or instead of the adhesive. However, the use of typical mechanical fasteners increases space requirements and part count where additional fasteners (i.e. screws) are required. An increase in part count is highly undesirable as it generally translates into reduced reliability and increased cost. Also, the fasteners must be manually positioned and assembled.

In addition, during fabrication of a device which uses the structure shown in FIG. 1, repeated thermal cycling may be required to cure or solder other components of the device. However, various parts, such as the mechanical fasteners and the adhesive, have different thermal properties. Therefore, a stress point where the flex circuit couples with the rigid structure after thermal cycling may be created. Further, the increased amount of parts decreases the reliability. More specifically, the increased part count increases the possibility of failures as there are a greater number of parts that may possibly fail. Vibration, static stresses, and thermal excursions experienced over the life of the assembly may be contributing factors to mechanical failure.

In addition, the adhesive in the assembly shown in related-art FIG. 1 minimizes reworkability of both the flex circuit 10 and the PCB 14. In particular, the use of adhesive makes it difficult to decouple the flex circuit from the rigid structure should a user decide to reuse the component.

Therefore, a need exists for an assembly that couples a flex circuit with a rigid structure in a mechanically robust manner. Furthermore, a need exists to reduce the costs associated with devices using the assembly.

SUMMARY OF THE INVENTION

Accordingly, the present invention is directed to a flex circuit assembly that substantially obviates one or more of the problems due to limitations and disadvantages of the related art.

An advantage of the present invention is to provide a mechanically robust interconnection between a flex circuit and a rigid structure. The present invention also provides a mechanical interconnection which minimizes strain where a flex circuit interfaces with a rigid structure. Embodiments of the invention use little board space and eliminate the need for adhesives.

To achieve these and other advantages and in accordance with the purpose of the present invention, as embodied and broadly described, a flex circuit assembly is disclosed and may be used with a rigid structure in one embodiment. The flex circuit assembly includes a staple configured to extend into the rigid structure. In this embodiment, a flex circuit extends between a portion of the staple and the rigid structure such that the staple couples the flex circuit with the rigid structure.

In another aspect of the present invention, a flex circuit assembly for coupling a flex circuit to a rigid structure is disclosed. The flex circuit assembly comprises a staple having a first post and a second post opposite the first post. The first post and the second post are configured for insertion into a surface of the rigid structure. Moreover, the first post and the second post are spaced apart from one another such that the flex circuit extends between the first post and the second post when the flex circuit couples with the rigid structure.

In a further embodiment of the present invention, a flex circuit assembly for coupling an electrical device with a rigid structure is disclosed. The flex circuit assembly includes a flex circuit which couples with the electrical device and a staple. The staple is configured to extend into the rigid structure where the flex circuit extends between a portion of the staple and the rigid structure. The flex circuit couples with the rigid structure such that the flex circuit couples the electrical device with the rigid structure.

It is to be understood that both the foregoing general description and the following detailed description are exemplary and explanatory and are intended to provide further explanation of the invention as claimed. Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

BRIEF DESCRIPTION OF THE DRAWINGS

The accompanying drawings, illustrate embodiments of the invention and together with the description serve to explain the principles of the invention.

FIG. 7 is a side view of a flex circuit coupling an electronic package with a PCB in accordance with an embodiment of the present invention.

DETAILED DESCRIPTION OF THE ILLUSTRATED EMBODIMENTS

Figure 1:
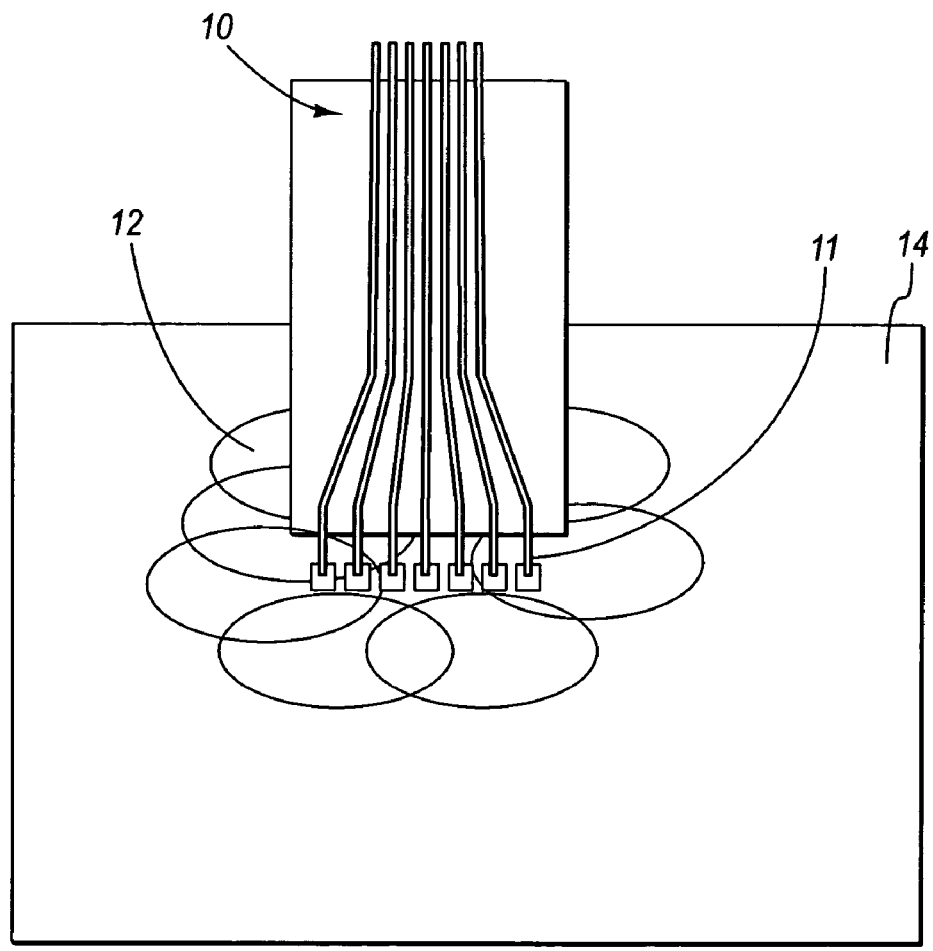
FIG. 1 is a top view of a flex circuit coupled with a rigid structure in accordance with the related art.
Figure 2:
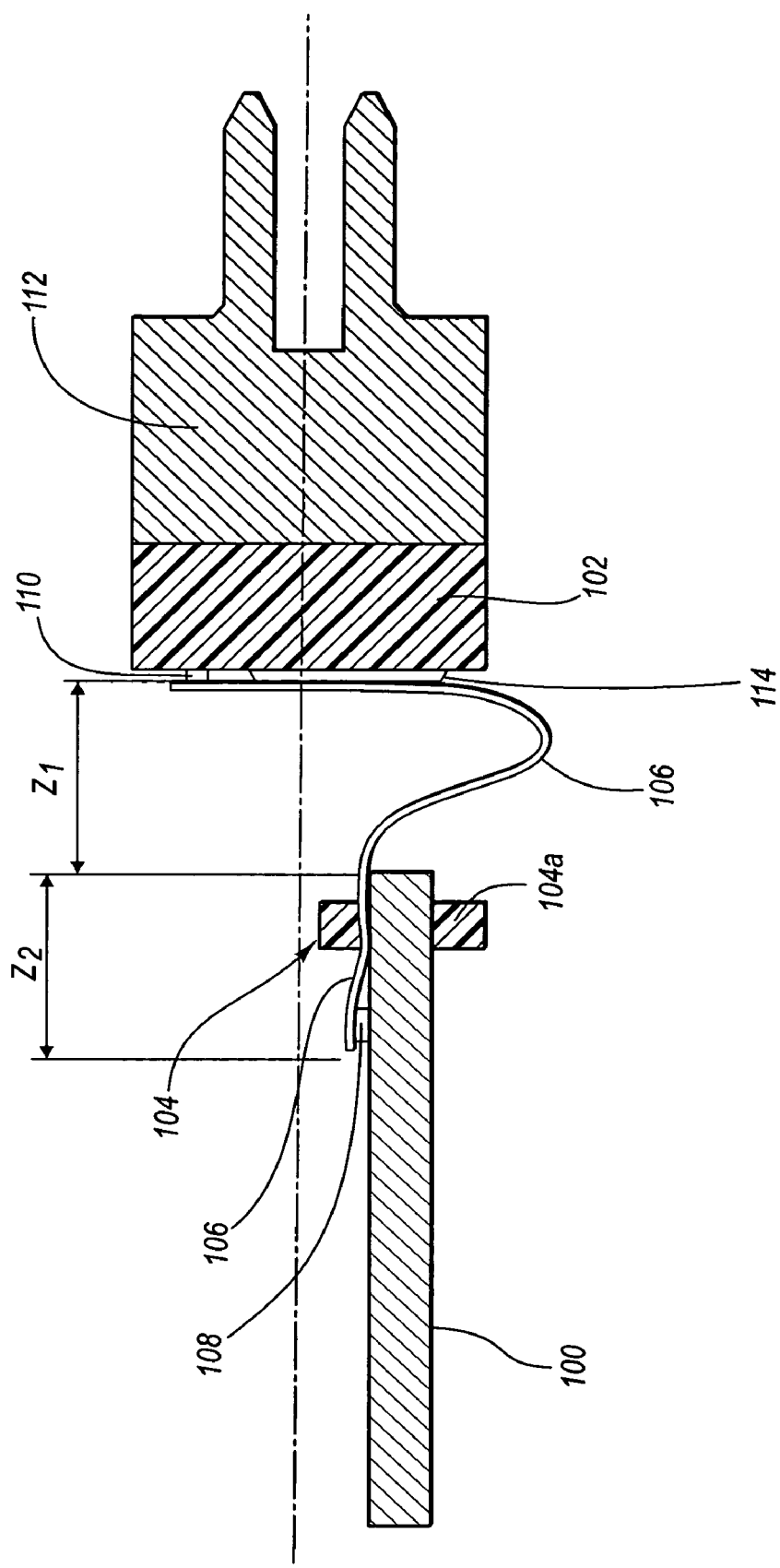
FIG. 2 is a side view of a flex circuit coupled with a PCB and an electronic package in accordance with an exemplary embodiment of the present invention.

FIG. 2 is a side view of a flex circuit 106 coupled with a PCB 100 and an electric assembly. The electric assembly may include an optoelectronic package 102 and a plastic injection molded fiber optic alignment sleeve 112 in accordance with an exemplary embodiment of the present invention. The flex circuit 106 may be any conventional type of flex circuit which provides an electrical interconnect between a rigid structure and an electrical device. The flex circuit 106 comprises a multilayer material enclosed within a mask. It should be noted that the flex circuit 106 may couple any rigid structure, such as the PCB 100, with any electrical device, such as the optoelectronic package 102. The optoelectronic package 102 may be a TO can device or a standard transistor package and may include a laser or photodetector for use in vertical cavity surface emitting laser (VCSEL) applications and the like. Further, the optoelectronic package 102 may be constructed of either a metal, plastic, or a ceramic. The plastic injection molded fiber optic alignment sleeve 112 may include a lens which provides optical alignment to a laser or a photodetector in the optoelectronic package 102.

In this example, a solder interconnect 110 electrically interconnects the flex circuit 106 with the optoelectronic package 102 in two locations. The solder interconnect 110 provides a electrically conductive interface between the flex circuit 106 and the optoelectronic package 102.

Figure 3:
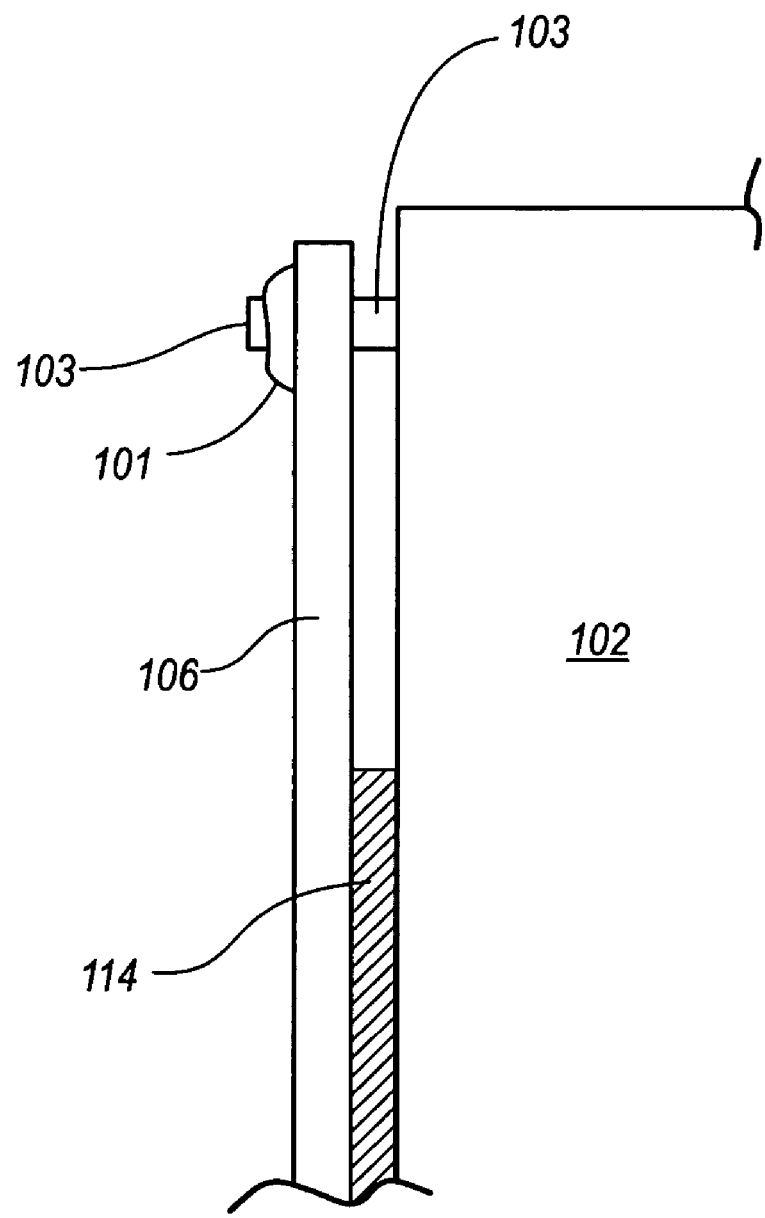
FIG. 3 is a side view of a flex circuit coupled with an electronic package in accordance with an alternative embodiment of the present invention.

It should be noted that in accordance with an alternative embodiment of the present invention, the flex circuit 106 may interface with the optoelectronic package 102 as shown in FIG. 3. FIG. 3 is a side view of the flex circuit 106 coupling with the optoelectronic package 102 in accordance with an alternative embodiment of the present invention. Here, the optoelectronic package 102 includes a lead 103 extending there from and through the flex circuit 106, as shown in FIG. 3. A solder fillet 101 binds the flex circuit 106 with the lead 103 at a backside of the flex circuit 106, thereby holding the flex circuit 106 in place.

Returning to FIG. 2, the flex circuit 106 also couples with the optoelectronic package 102 with an adhesive 114. The adhesive 114 may be any type of adhesive capable of attaching the flex circuit 106 to the optoelectronic package 102 such as glue, a thermoset resin, a pressure-sensitive adhesive layer and the like. In one embodiment of the present invention, the adhesive 114 provides strain relief for the electrical interconnect between the flex circuit 106 and the optoelectronic package 102.

Figure 4:
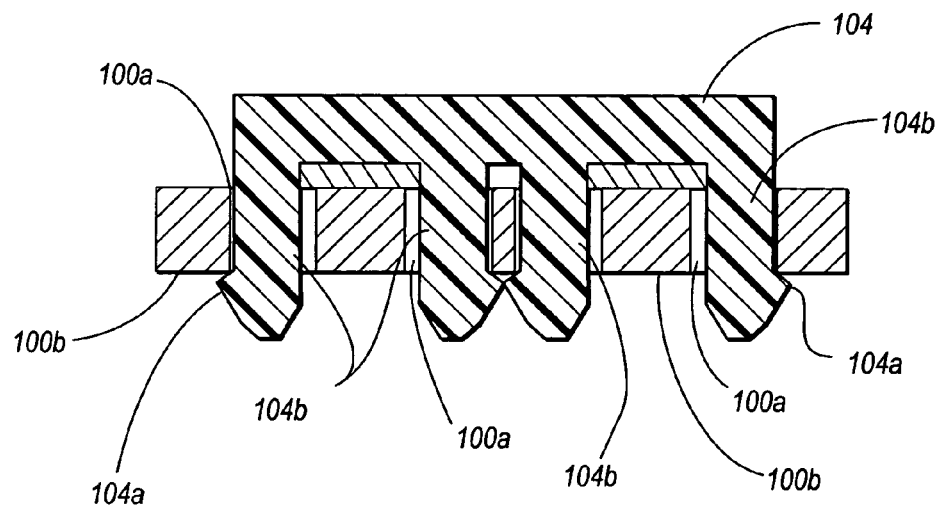
FIG. 4 is a front view of a flex circuit coupled with a PCB using a staple in accordance with one embodiment of the present invention.

The flex circuit 106 also couples with the PCB 100 as shown in FIG. 2. In this embodiment, the flex circuit 106 couples with the PCB 100 via a staple 104 and a solder interconnect 108. As shown in FIG. 4, the flex circuit 106 passes between posts 104b of the staple 104. The posts 104b extend through passageways 100a of the PCB 100 and past a bottom surface 100b of the PCB 100. Barbs 104a of the staple 104 engage the bottom surface 100b (or internal surfaces of the passageways) thereby coupling the staple 104 with the PCB 100. In addition, the posts 104b align the staple 104 with the PCB 100 as more clearly shown in FIG. 5.

The staple 104 provides several advantages. The staple 104 provides strain relief thereby increasing reliability. In addition, a single staple can be used to retain multiple flex pieces. In addition and as describe more fully with reference to FIGS. 5A and 5B, a staple can provide self alignment features such that a flex circuit can be quickly positioned in multiple directions. For example, the alignment features of a staple can position the soldering pads of the flex circuit.

Figure 5A:
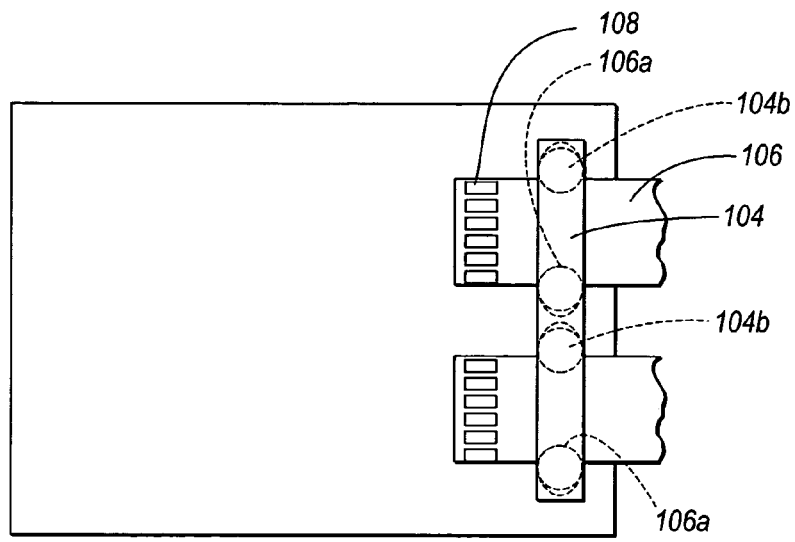
FIG. 5A is a top view of a flex circuit with a PCB in accordance with an embodiment of the present invention.

Now making reference to FIG. 5A, the flex circuit 106 includes half circles 106a disposed on opposing sides of the flex circuit 106 which self-align the flex circuit 106. In accordance with an embodiment of the present invention, a radius of curvature of the half circles 106a approximates a radius of curvature of posts 104b. As the radius of curvature of both the half circles 106a and the posts 104b approximate each other, the half circles 106a align with the posts 104b when the flex circuit 106 is placed within the posts 104b. When the flex circuit 106 engages with the staple 104, the flex circuit 106 self-aligns with the staple 104 and PCB 100. Thus, the flex circuit 106 self-aligns with the PCB 100 when the staple 104 and the posts 104b extend through the passageways 100a.

Figure 5B:
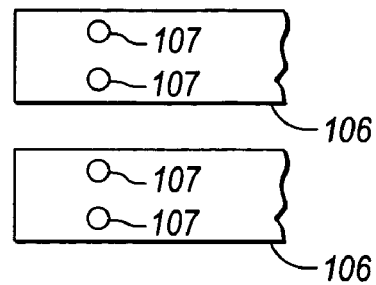
FIG. 5B is a top view of a flex circuit in accordance with an alternative embodiment of the present invention.

In accordance with a further embodiment of the present invention, the flex circuit 106 may also have circles 107, as shown in FIG. 5B. Here, the posts 104b of the staple 104 pass through the circles 107 when the flex circuit 106 couples with the PCB 100.

As may be seen with reference to FIG. 5A, the staple 104 uses a minimum amount of space on the PCB 100. As such, embodiments of the present invention allows for the integration of flex circuits with devices having space constraints.

Figure 6:
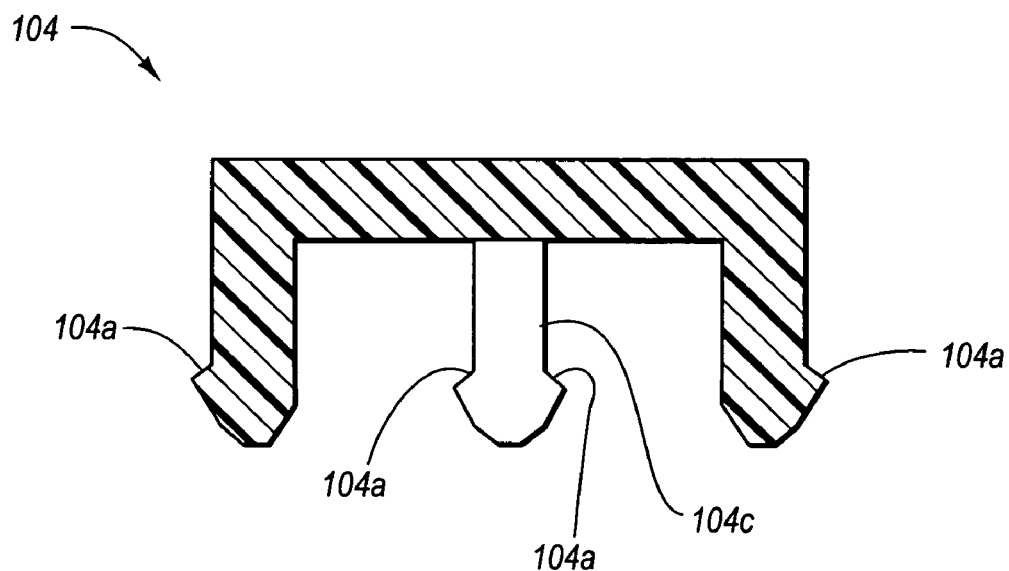
FIG. 6 is a front view of a staple in accordance with an alternative embodiment of the present invention.

In this example, the staple 104 includes four posts 104b as shown with reference to FIG. 4. However, it should be noted that the staple 104 may include any number of posts. For example, in accordance with an alternative embodiment of the present invention, the staple 104 may include three posts as shown in FIG. 6 where the staple 104 includes a post 104*c* having a set of the barbs 104*a*, as shown. It should be noted that in accordance with an embodiment of the present invention, additional barbs 104*a* may be disposed along the post 104*a*, as more clearly shown in FIGS. 8A and 8B.

FIG. 7 is an alternative embodiment of the present invention where a staple 109 couples the flex circuit 106 with the PCB 100. As may be seen in this embodiment, the staple 109 includes an internally radiused edge or chamfer 109*a* which allows flexing of the flex circuit 106 in an upward direction as shown in FIG. 7. In this embodiment, the chamfer 109*a* provides a smoothed edge about which the flex circuit 106 curves thereby decreasing stress and strain experienced by the flex circuit 106. As such, the embodiment illustrated in FIG. 7 increases the durability of the flex circuit 106.

The configuration of the staple 104 permits easy removal should the PCB 100, the optoelectronic package 102 or the plastic injection molded fiber optic alignment sleeve 112 fail. For example, if the PCB 100 fails, the flex circuit 106 may be easily removed from the PCB 100 and the flex circuit 106, along with the optoelectronic package 102 and the plastic injection molded fiber optic alignment sleeve 112, may be reused with another component. Alternatively, the flex circuit 106 itself can be easily replaced if necessary.

Figure 8A:
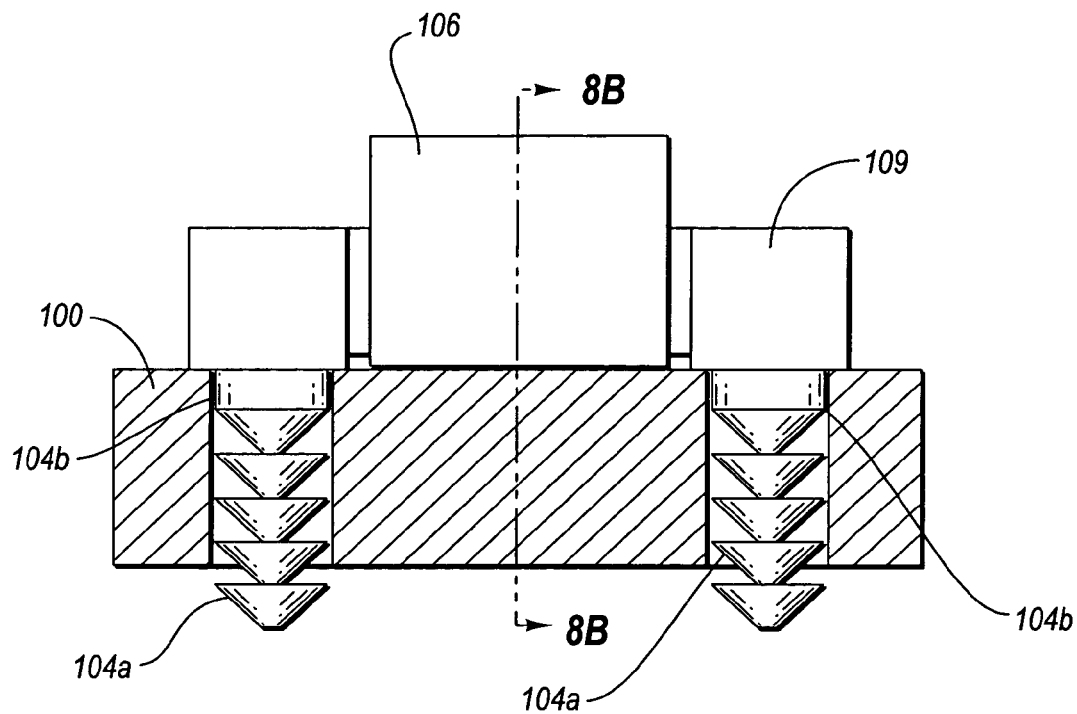
FIG. 8A is a side view of a flex circuit coupling an electronic package with a PCB in accordance with an embodiment of the present invention.

FIG. 8A illustrates view of a staple that is connected with a structure such as a PCB. In FIG. 8A, the staple 109 has posts 104*b* that extend through openings in the PCB 100. The barbs 104*a* on the posts 104*b* help the staple 109 connect with the PCB 100. The staple 109 can provide strain relief, for example, to the solder joints between the flex circuit 106 and the PCB 100.

Figure 8B:
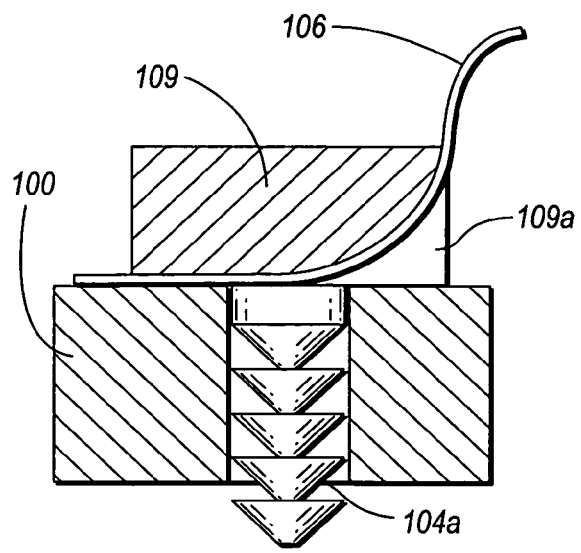
FIG. 8B is a side view of a flex circuit coupling an electronic package with a PCB in accordance with an embodiment of the present invention.

FIG. 8B illustrates a side view of one embodiment of the flex circuit assembly shown in FIG. 8A. FIG. 8A illustrates a chamfer 109*a* that in one embodiment, provides additional strain relief for the flex circuit 106. As previously described, the barbs 104*a* help secure the staple 109 within the openings of the PCB 100.

The present invention provides an attractive solution to engineers and designers wishing to incorporate flex circuits into electronic components. The present invention provides an assembly which allows easy integration of a flex circuit into a variety of devices. The devices which may use the present invention include optical transceivers, CD players, DVD players, CD-ROM drives, hard drives and the like. The staple of the present invention lends itself to automated processes since attaching the staple to the PCB is coupling one rigid structure with another rigid structure. Furthermore, the decreased part count minimizes the aforementioned thermal issues where different thermal properties of different materials increase the possibility of the creation of stress points during thermal cycling thereby reducing reliability. As such, the present invention decreases costs associated with coupling flex circuits with rigid structures, and more importantly, costs to consumers of goods which incorporate the present invention, such as the aforementioned devices.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flex circuit assembly for a rigid structure, the rigid structure including at least one conductive feature, the flex circuit assembly comprising:

a flex circuit having a flexibly flat body and including a plurality of conductive features; and a staple having one or more posts configured to extend into the rigid structure and secure the staple to the rigid structure, wherein the flex circuit extends between a portion of the staple and the rigid structure, the staple retaining the flex circuit with respect to the rigid structure such that the conductive features of the flex circuit couple with corresponding conductive features of the rigid structure at a point displaced from a longitudinal axis of the staple, the one or more posts comprising:

a first post;

a second post disposed opposite the first post, the first post and the second post extending into the rigid structure where the flex circuit extends between the first post and the second post; and an alignment feature that cooperates with the flex circuit to align the flex circuit in one or more directions, wherein the first post and the second post of the staple have a radius of curvature, the radius of curvature forming at least a portion of the alignment feature, and wherein the flex circuit further comprises:

a first half circle having a radius of curvature disposed on a first side of the flex circuit; and a second half circle having a radius of curvature disposed on a second side of the flex circuit wherein the radius of curvature of both the flex circuit first half circle and the flex circuit second half circle correspond to the radius of curvature of the first post and the second post such that the flex circuit self aligns with both the rigid structure and the staple when the flex circuit couples with the rigid structure.

2. The flex circuit assembly as recited in claim 1, wherein the rigid structure is a printed circuit board (PCB).

3. The flex circuit assembly as recited in claim 1, wherein the staple is made of plastic.

4. The flex circuit assembly as recited in claim 1, wherein the flex circuit forms an electrical interconnect between the rigid structure and an electrical device.

5. The flex circuit assembly as recited in claim 4, wherein the electrical device has a photodetector.

6. The flex circuit assembly as recited in claim 4, wherein the electrical device further include a lead extending there from, the lead extending through the flex circuit to a backside of the flex circuit wherein the flex circuit couples with the lead of the electrical device at the backside of the flex circuit with a solder fillet.

7. The flex circuit assembly as recited in claim 1, wherein the first post and the second post have barbs.

8. The flex circuit assembly as recited in claim 1, wherein there are three or more posts.

9. The flex circuit assembly as recited in claim 1, the staple further comprising:

an edge radius at an edge of the staple where the flex circuit engages with the edge radius when the flex circuit couples with the rigid structure such that the flex circuit curves upwardly relative to both the staple and the rigid structure.

10. A flex circuit assembly for a rigid structure, the flex circuit assembly comprising:

a flex circuit; and a means for coupling the flex circuit with the rigid structure, the means for coupling extending into the rigid structure, wherein the flex circuit extends between the means and the rigid structure such that the flex circuit mechanically couples with the rigid structure, and wherein the means for coupling includes:

a first post having a radius of curvature; and a second post having a radius of curvature and disposed opposite the first post, the first post and the second post extending into the rigid structure where the flex circuit extends between the first post and the second post; and wherein the flex circuit further comprises:

a first half circle having a radius of curvature disposed on a first side of the flex circuit; and a second half circle having a radius of curvature disposed on a second side of the flex circuit wherein the radius of curvature of both the flex circuit first half circle and the flex circuit second half circle correspond to the radius of curvature of the first post and the second post such that the flex circuit self aligns with the rigid structure when the flex circuit couples with the rigid structure.

11. A method of forming a flex circuit assembly for a rigid structure having a plurality of conductive features, the method comprising:

providing a flex circuit having a flexibly flat body and including a plurality of conductive features;

providing a staple, the staple having one or more posts that secure the staple to the rigid structure to provide strain relief to the flex circuit, the one or more posts having an alignment feature;

aligning the flex circuit with the rigid structure using the alignment feature; and coupling the conductive features of the flex circuit with the conductive features of the rigid structure at a location that is displaced from a longitudinal axis of the staple, wherein the staple extends into the rigid structure such that the flex circuit is disposed between the staple and the rigid structure, wherein the one or more posts further comprise:

a first post; and a second post disposed opposite the first post, the first post and the second post extending into the rigid structure where the flex circuit extends between the first post and the second post, wherein the first post and the second post have a radius of curvature that form at least a portion of the alignment feature, and wherein the flex circuit further comprises:

a first half circle having a radius of curvature disposed on a first side of the flex circuit; and a second half circle having a radius of curvature disposed on a second side of the flex circuit wherein the radius of curvature of both the flex circuit first half circle and the flex circuit second half circle correspond to the radius of curvature of the first post and the second post such that the flex circuit self aligns with the rigid structure when the flex circuit couples with the rigid structure.

\* \* \* \* \*

UNITED STATES PATENT AND TRADEMARK OFFICE
CERTIFICATE OF CORRECTION

| | |
|---|---|
| PATENT NO. | : 7,425,135 B2 |
| APPLICATION NO. | : 11/094990 |
| DATED | : September 16, 2008 |
| INVENTOR(S) | : Liu et al. |

It is certified that error appears in the above-identified patent and that said Letters Patent is hereby corrected as shown below:

Column 1
Line 53, change "111" to --11--

Column 6
Line 43, change "include" to --includes--

Signed and Sealed this

Fourteenth Day of September, 2010

David J. Kappos
*Director of the United States Patent and Trademark Office*